US008172582B2

(12) United States Patent
Szu et al.

(10) Patent No.: US 8,172,582 B2
(45) Date of Patent: May 8, 2012

(54) IC SOCKET HAVING A HOUSING PROVIDED WITH A REINFORCED PLATE TO SUPPORT A LATCH MEMBER

(75) Inventors: Ming-Lun Szu, Tu-Cheng (TW); Hsiu-Yuan Hsu, Tu-Cheng (TW); Ke-Hao Chen, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 107 days.

(21) Appl. No.: 12/833,007

(22) Filed: Jul. 9, 2010

(65) Prior Publication Data
US 2011/0008987 A1    Jan. 13, 2011

(30) Foreign Application Priority Data
Jul. 9, 2009    (TW) .................................. 98212507

(51) Int. Cl.
*H01R 12/00* (2006.01)
(52) U.S. Cl. ........................... 439/71; 439/330; 439/342
(58) Field of Classification Search .......... 439/330–331, 439/71, 342
See application file for complete search history.

(56) References Cited

U.S. PATENT DOCUMENTS

| | | | | |
|---|---|---|---|---|
| 4,789,345 A * | 12/1988 | Carter | ............................. | 439/71 |
| 5,364,286 A * | 11/1994 | Matsuoka | ..................... | 439/330 |
| 5,409,392 A * | 4/1995 | Marks et al. | ................... | 439/266 |
| 5,865,639 A * | 2/1999 | Fuchigami et al. | ........... | 439/330 |
| 5,902,144 A * | 5/1999 | Hay | ............................... | 439/342 |
| 7,195,507 B2 * | 3/2007 | Watanabe | ..................... | 439/331 |

* cited by examiner

*Primary Examiner* — Truc Nguyen
(74) *Attorney, Agent, or Firm* — Andrew C. Cheng; Wei Te Chung; Ming Chieh Chang

(57) ABSTRACT

An IC socket comprises a socket body, a plurality of contacts, an actuator mounted on the socket body and moveable up-and-down relative to the socket body, and a latch member configured with one end thereof connecting with the actuator via a pivotal shaft and another end thereof movably connecting with the socket body. When the actuator is moved downwardly, the pivotal shaft is pushed downwardly and drives the latch member to rotate from a closed position to an open position. The actuator further defines a supporting element extending to a position under the latch member for abutting against the latch member during rotational movement of the latch member.

15 Claims, 13 Drawing Sheets

US 8,172,582 B2

IC SOCKET HAVING A HOUSING PROVIDED WITH A REINFORCED PLATE TO SUPPORT A LATCH MEMBER

BACKGROUND OF THE INVENTION

1. Field of the Invention

The present invention relates to an IC socket, and more particularly to an IC socket having a housing provided with a reinforced plate to support and prevent the latch member from deformation.

2. Description of Prior Art

An IC package, such as a CPU (Central Processing Unit), is generally used in a computer system and needs to be tested before using in the computer system via an IC socket.

FIGS. 1-3 disclose an IC socket 2 relating to the prevent invention for testing an IC package (not shown). The IC socket 2 comprises an insulative housing 20 having a plurality of contacts, an actuator 24 mounted upon and moveable relative to the housing 20, a latch member 26 attached to the actuator 24 via a pivot shaft 264 and movably attached to the housing 20, respectively, and a number of springs 28 arranged between the housing 20 and the actuator 24. When the actuator 24 is moved toward the housing 20 from an initial position to a final position under an external force, the pivot shaft 264 is moved toward the housing 20 as driven by the force from the actuator 24 and drives the latch member 26 to rotate from a locked position to an open position. Also, the latch member 26 will be moved downwardly. At this time, the IC package can be disposed in the IC socket 2. When the external force is released, the actuator 24 will move upwardly and rotate toward its initial position as driven by the elastic force of the spring. Accordingly, the latch member 26 will go back to its locked position and the IC package will be locked.

During the above-described process, obviously, the actuator 24 exerts a downward force on a middle position of the pivot shaft 26. Additionally, the springs 28 will exert an upward force on opposite ends of the pivot shaft 26 due to the deformation resulted from downward movement of the actuator 24. Thus, the pivot shaft 26 may be warped upwardly at the opposite ends and warped downwardly at the middle position. Accordingly, downward movement of the latch member 26 will be negatively affected.

In view of the above, an improved electrical socket that overcomes the above-mentioned disadvantages is desired.

SUMMARY OF THE INVENTION

Accordingly, an object of the present invention is to provide an IC socket, and more particularly to an IC socket having a housing provided with a reinforced plate to support and prevent the latch member from deformation To achieve the above-mentioned object, an IC socket comprises a socket body, a plurality of contacts, an actuator mounted on the socket body and moveable up-and-down relative to the socket body, and a latch member configured to have one end thereof adapted to be connected with the actuator via a pivotal shaft and another end thereof movably connecting with the socket body. When the actuator is moved downwardly, the pivotal shaft is pushed downwardly and drives the latch member to rotate from a closed position to an open position. The actuator further defines a supporting element extending to a position under the latch member for abutting against the latch member during rotational movement of the latch member. During the rotational movement of the latch member, the supporting element will abut against a bottom portion of the latch member such that the pivotal shaft could be effectively prevented from warpage and deformation resulted from excessive operating force.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Figure 1:
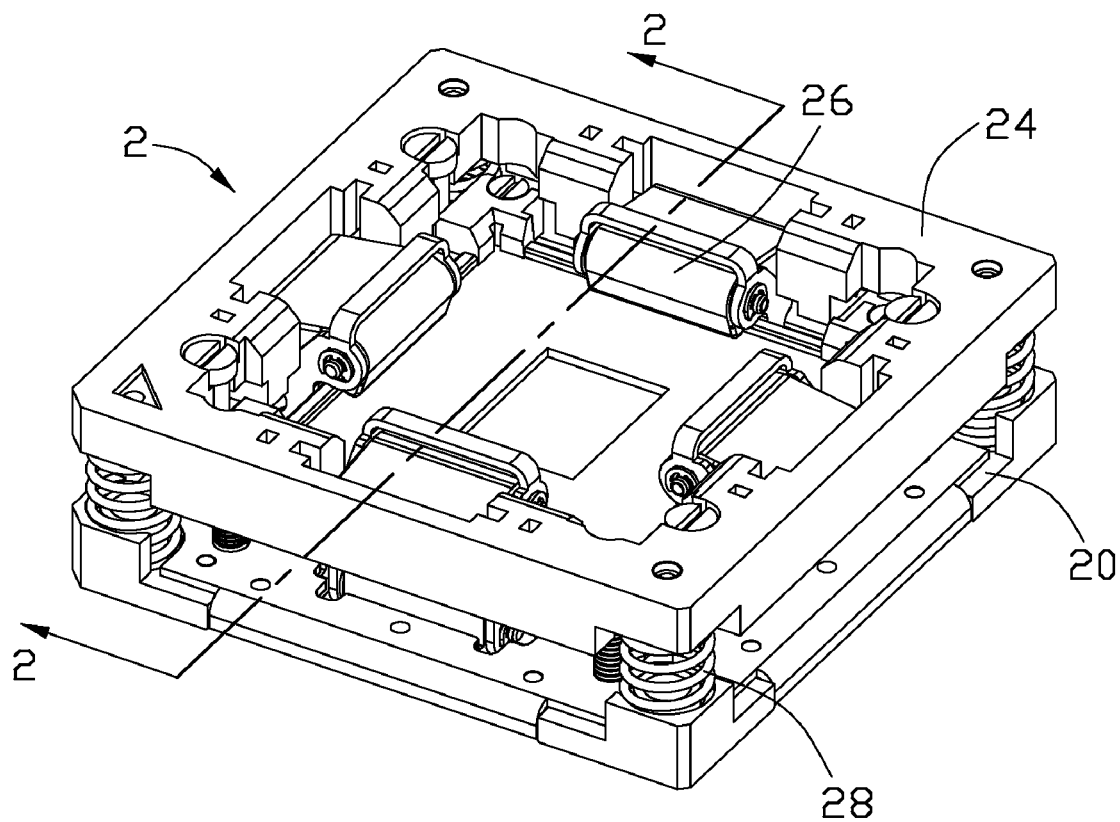
FIG. 1 is an isometric view of a conventional IC socket.
Figure 2:
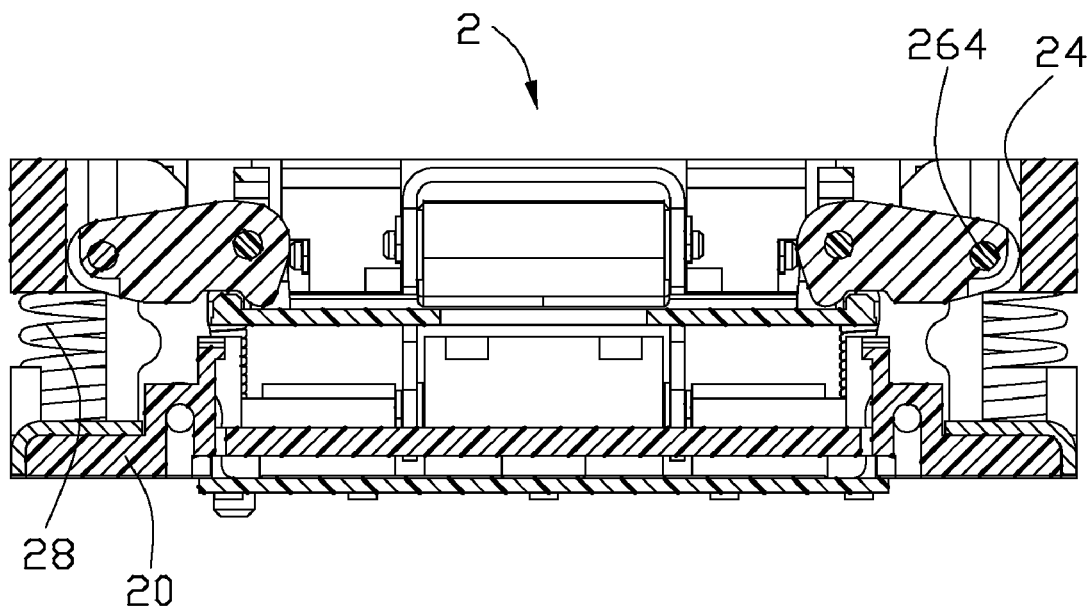
FIG. 2 is a cross-sectional view taken along line 2-2 in FIG. 1, wherein the latch member is at a closed position.
Figure 3:
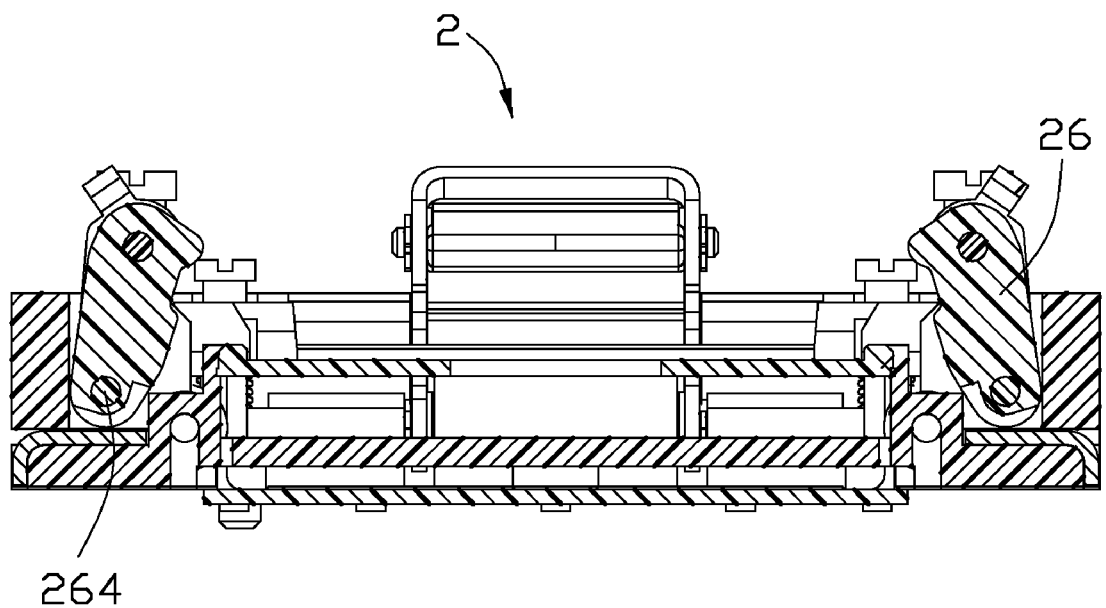
FIG. 3 is a cross-sectional view of conventional IC socket, wherein the latch member is at an open position.

Reference will now be made to the drawings to describe the present invention in detail.

Referring to FIGS. 4-13, an IC socket 1 in accordance with a preferred embodiment of the present invention is used for testing an IC package (not shown), comprising a socket body 10, a plurality of spring contacts 12 received in the socket body 10, an actuator 14 mounted on the socket body 10 and moveable up-and-down relative to the socket body 10, and a plurality of latch members 16 and spring members 18 arranged between the socket body 10 and the actuator 14.

Figure 4:
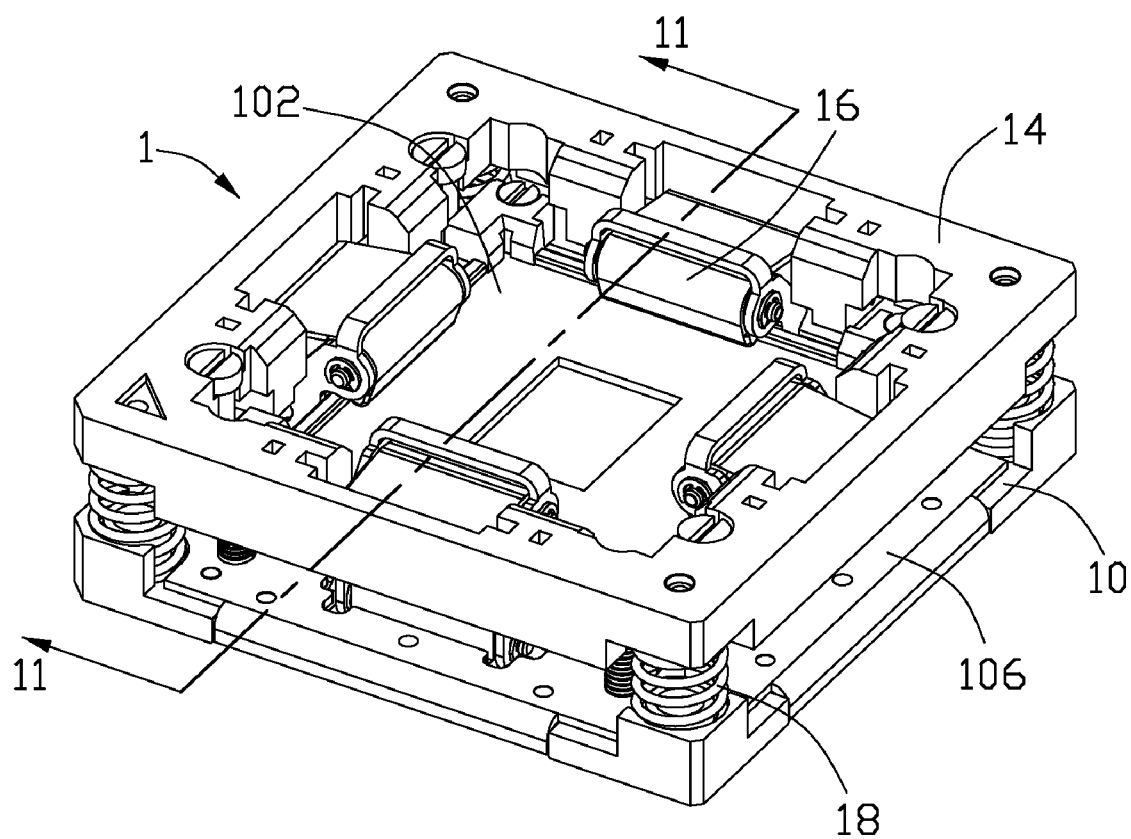
FIG. 4 is an isometric view of an IC socket in accordance with a preferred embodiment of the present invention, wherein the latch member is at a closed position.
Figure 5:
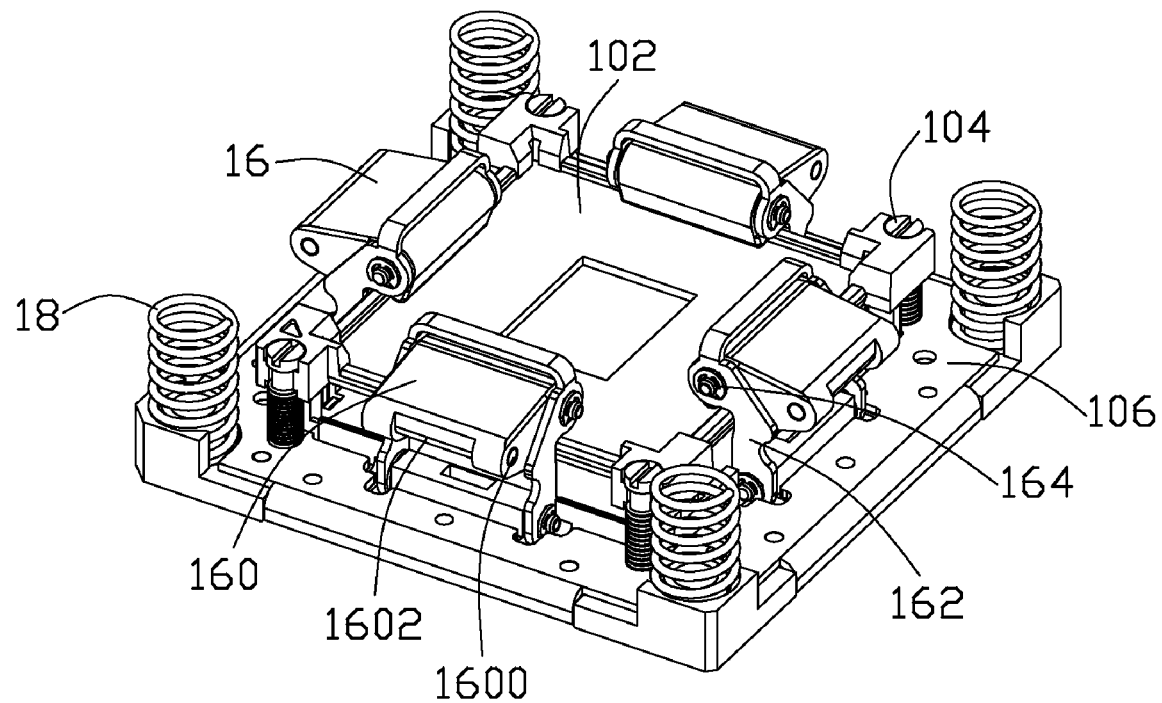
FIG. 5 is an assembled view of the electrical socket excluding a frame.
Figure 6:
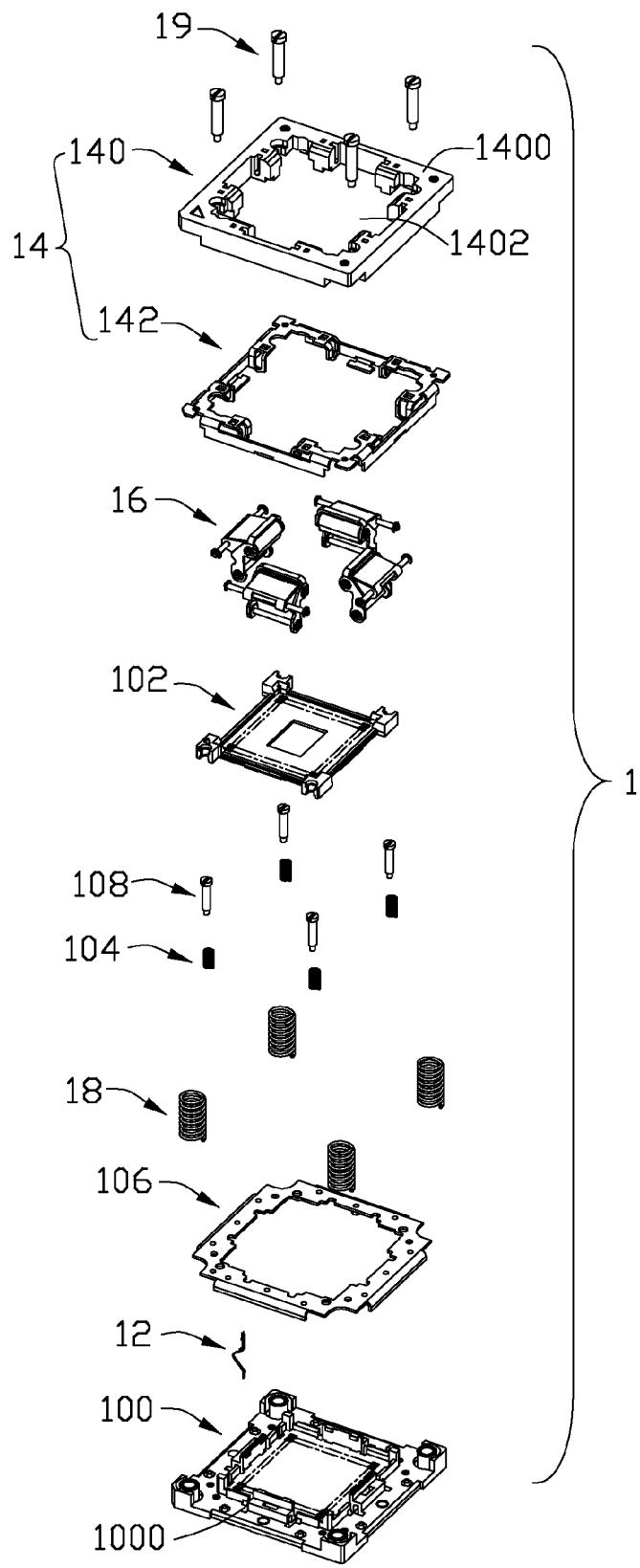
FIG. 6 is an isometric, exploded view of the IC socket shown in FIG. 5.
Figure 7:
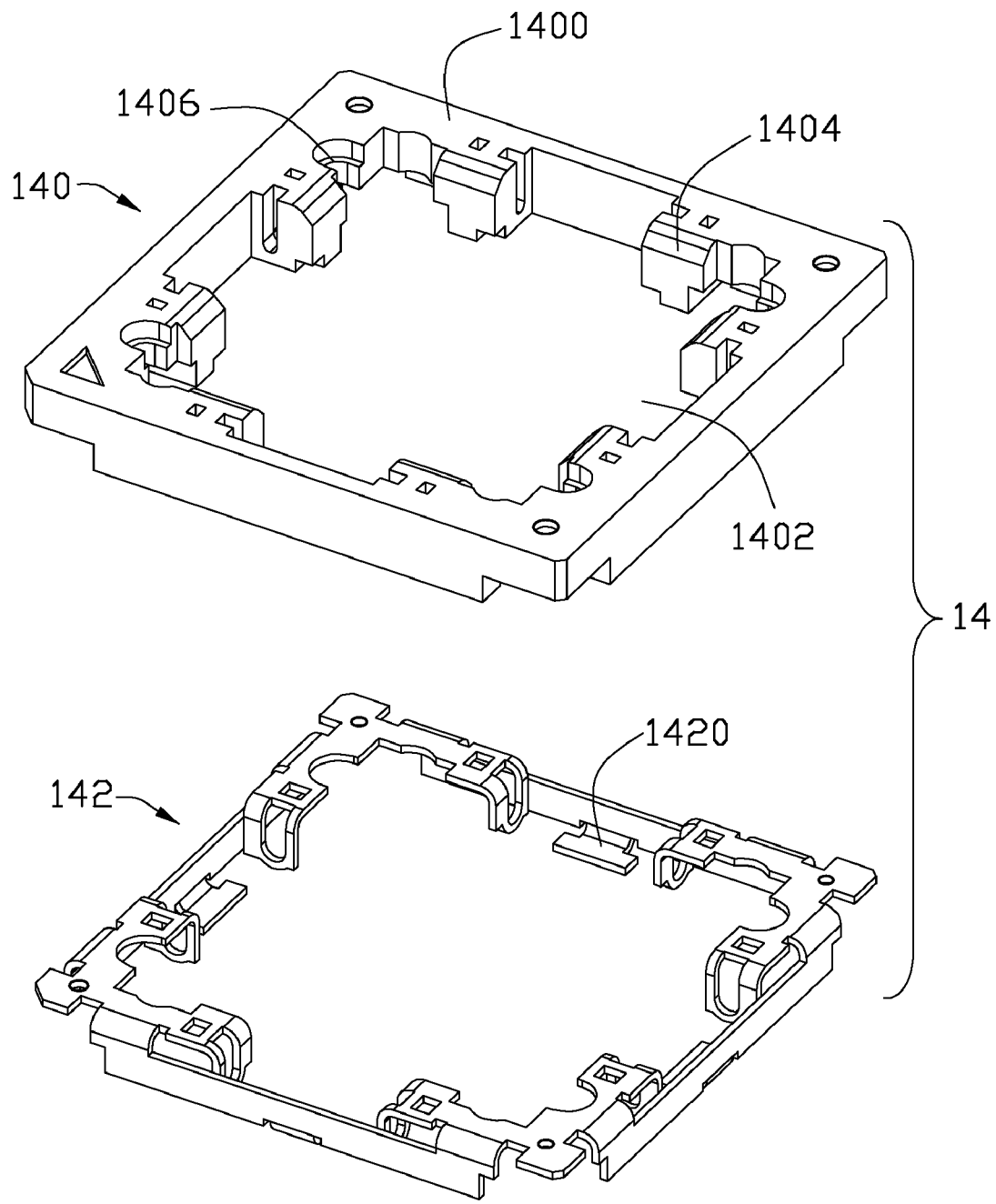
FIG. 7 is an isometric view of the frame and a reinforced plate.
Figure 8:
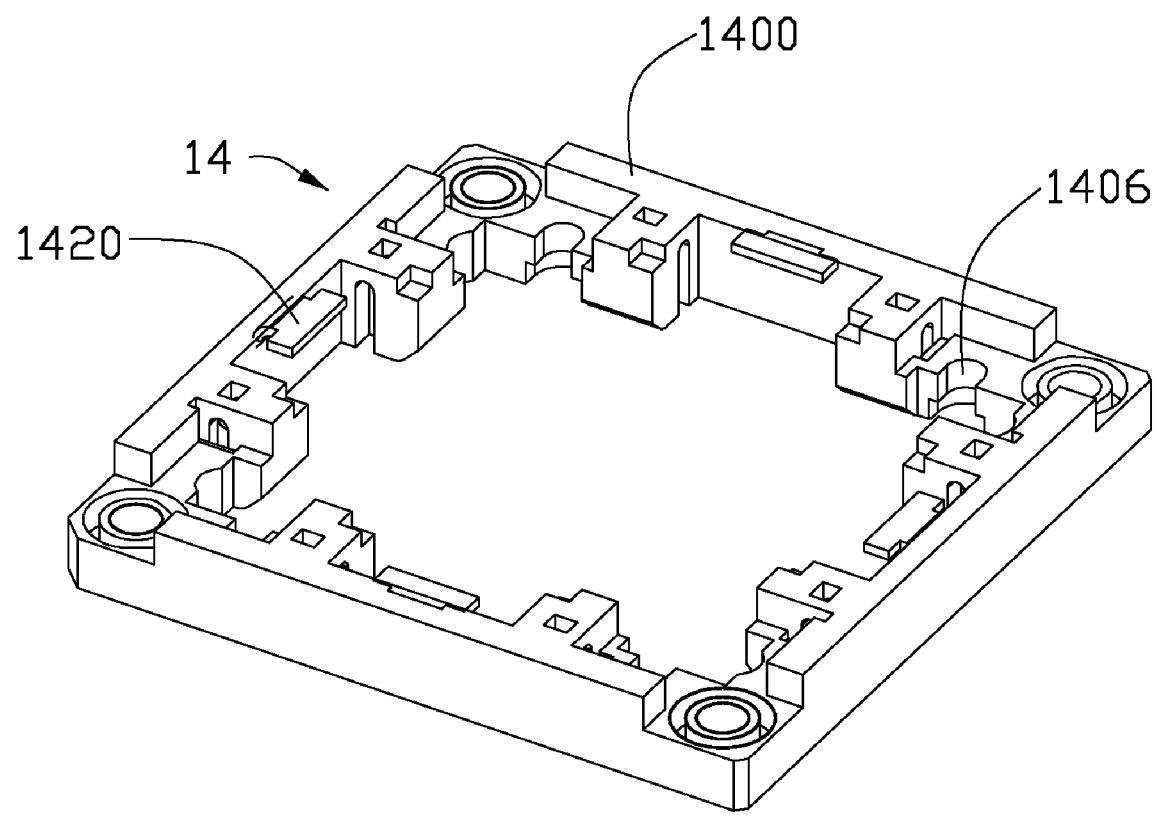
FIG. 8 is an assembly of the frame and the reinforced plate.
Figure 9:
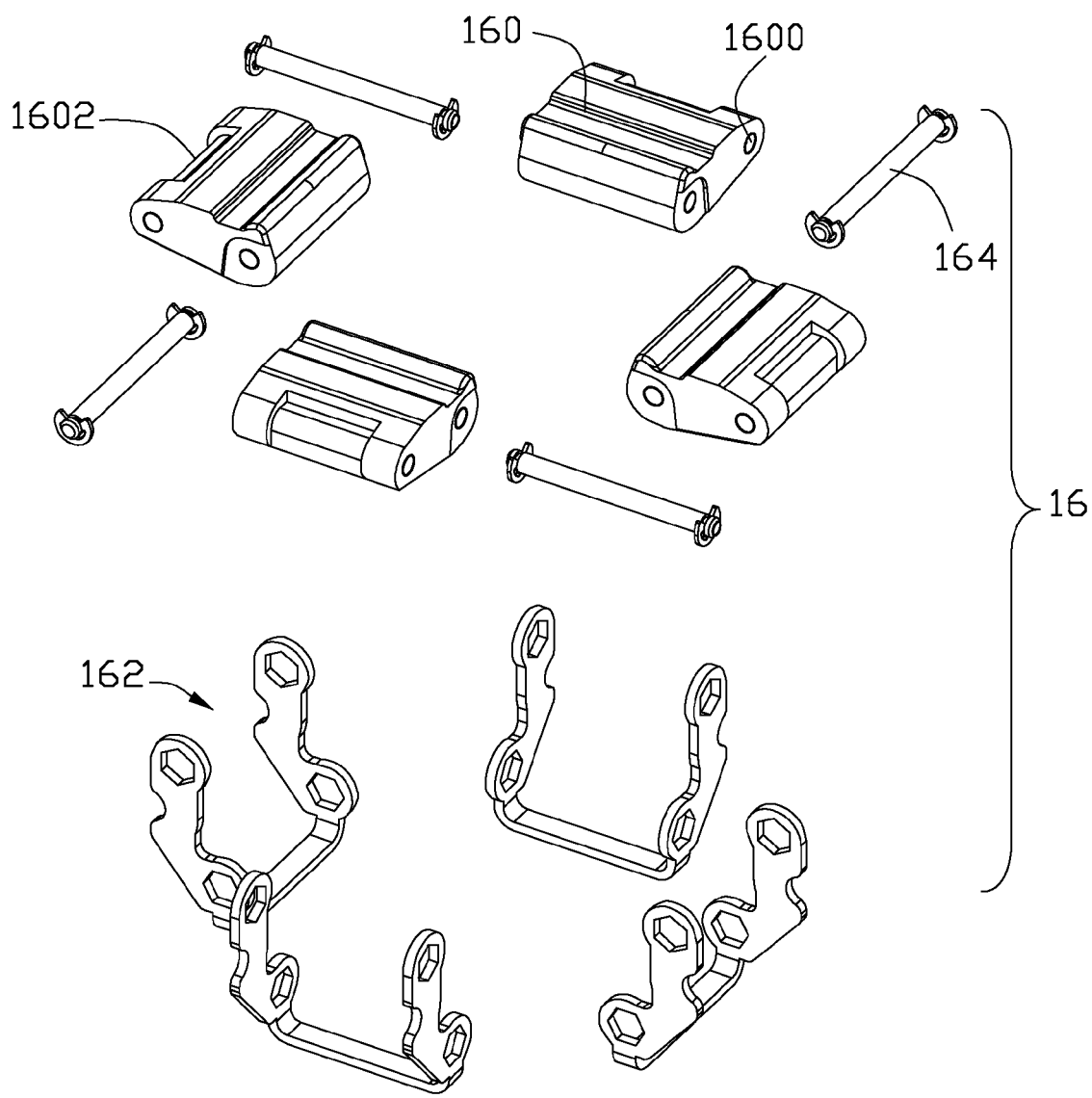
FIG. 9 is an exploded view of the latch member of the IC socket.
Figure 10:
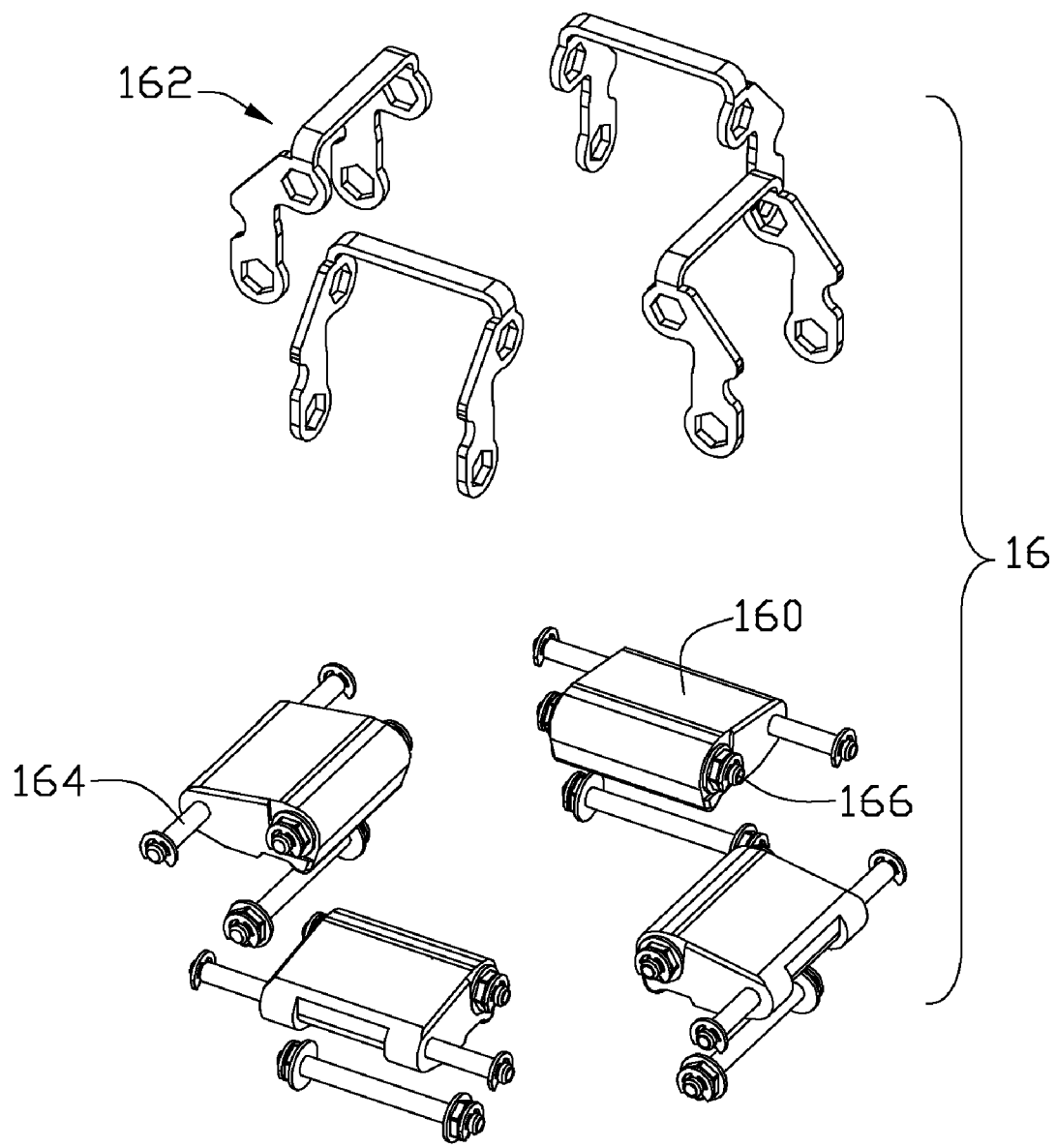
FIG. 10 is an exploded view of the latch member of the IC socket.
Figure 11:
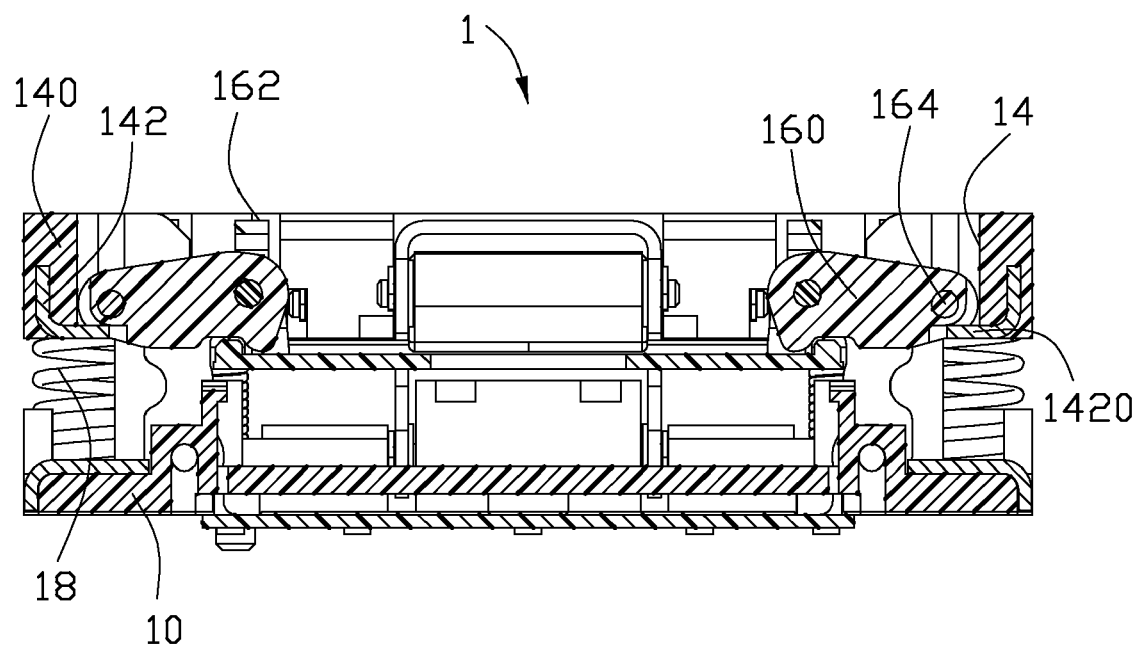
FIG. 11 is a cross-sectional view taken along line 11-11 in FIG. 4.
Figure 12:
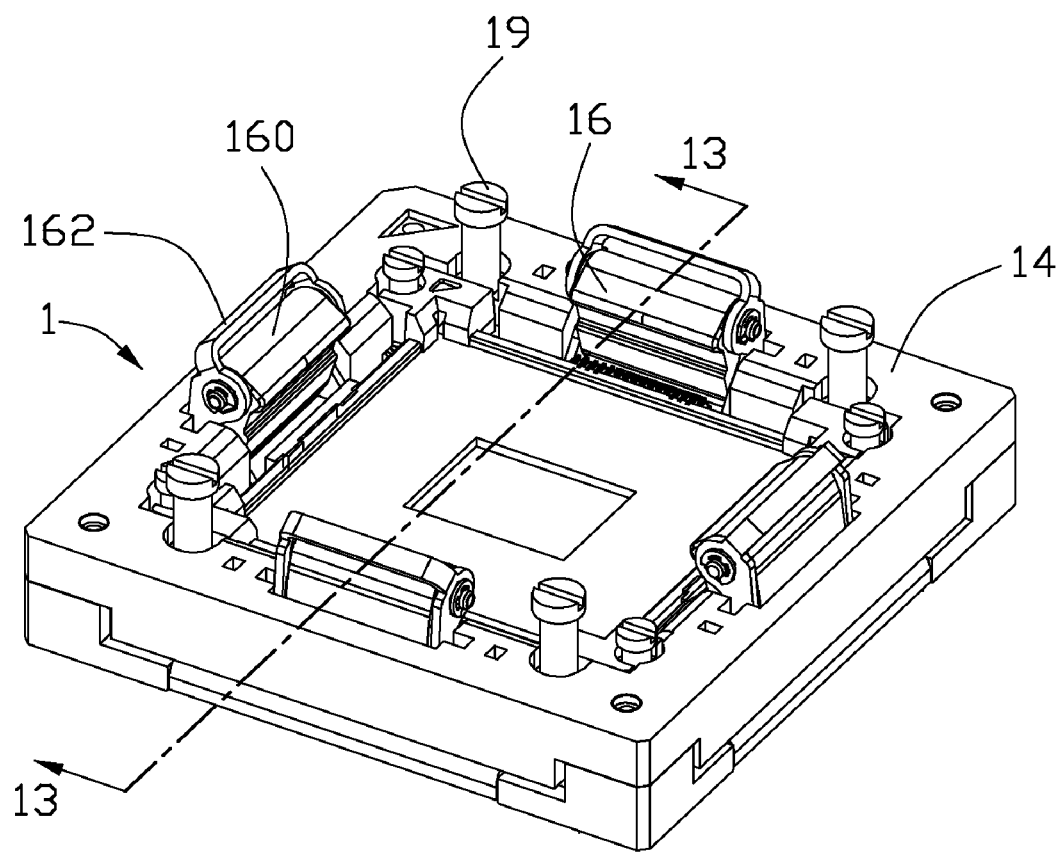
FIG. 12 is an isometric view of an the IC socket in accordance with the preferred embodiment of the present invention, wherein the latch member is at an open position.
Figure 13:
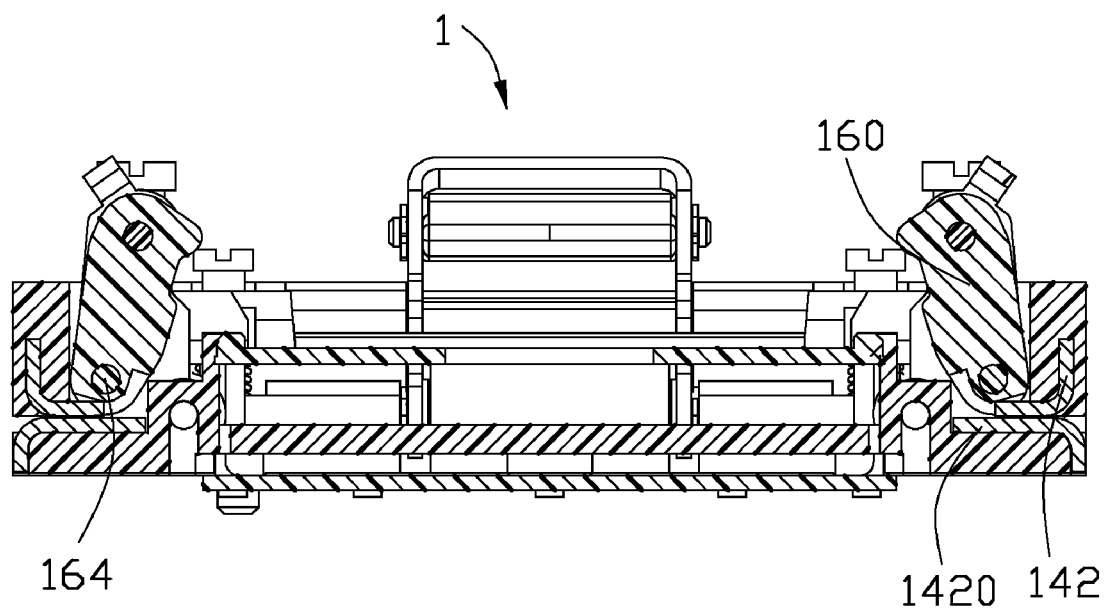
FIG. 13 is a cross-sectional view taken along line 13-13 in FIG. 12.

The socket body 10 comprises a base 100 and an adapter 102 moveably mounted on the base 100 from an upper face of the base 100. The adapter 102 is configured to support and receive the IC package mounted thereon. The adapter 102 is connecting with the base 100 via a plurality of posts 108 and a plurality of springs 104 arranged between the base 100 and the adapter 102. Thus, when a force is exerted down on the adapter 102, the adapter 102 will be moved downwardly toward the base 100; when the force is released, the adapter 102 will be driven to move upwardly as driven by the elastic force of the springs 104. The plurality of contacts 12 is received in the base 100. Referring to FIGS. 4-6, a metallic reinforced frame 106 is assembled on the upper face the base 100 for increasing strength of the 100. The posts pass through the reinforced frame 106.

The actuator 14 comprises a frame 140 and an reinforced plate 142 formed with metallic material. The reinforced plate 142 is integrally formed with the frame 140. The frame 140 has four sides 1400, which cooperatively define a passage 1402 therebetween for allowing the IC package to pass therethrough. Two sides 1402 each define two spaced protrusions 1404 in a middle region thereof, respectively. The latch member 15 is received between the two protrusions 1404. Two holes 140 are disposed at an outer region of the two protrusions 1404. Thus, four connecting member 19 are disposed in the holes 140 for movably connecting the frame 140 with the socket body 10.

Each side 1400 of the frame 140 has a latch member 16 arranged thereon. The latch member 16 is configured with one end thereof connecting with the frame 140 of the actuator 14 via a pivotal shaft 164 and another end thereof movably connecting with the base 100. The latch member 16 comprises a push block 160, a connecting bar 164 and a plurality of pivotal shafts 164. Referring to FIGS. 5-6 and 9-10, the push block 160 defines a receiving hole 1600 at one end thereof. The pivotal shaft passes through the receiving hole 1600 and connects with the frame 140. The push block 160 defines a through hole (not shown) for assembling with the one end of the connecting bar 162 via a securing member 166. Another end of the connecting bar 162 is movably connecting with the fixed portion 1000 of the base 100 such that rolling movement of the push block 160 is ensured.

The reinforced plate 142 is configured with the frame 140 and also has four sides that cooperatively define a passageway therebetween. Each side of the reinforced plate 142 bends at a middle portion such that a supporting element 1420 is formed. The supporting element 1420 extends to a lower position under the push block 1600 of the latch member 16. Additionally, the supporting element 1420 is located at a lower position under a middle portion of the pivotal shaft 164.

The middle portion of the pivotal shaft 164 is received in the latch member 16 and two ends of the pivotal shaft 164 are received in the frame 140. When an external force is exerted down on the frame, the pivotal shaft 164 is moved downwardly. Accordingly, the latch member 16 is rotated from a closed position to an open position. At this time, the IC package can be disposed on to the adapter 102. When the force is released, the latch member 16 will rotate back to the closed position and the IC package will be locked. Then, a testing process will be implemented. During above process, the supporting element 1420 of the reinforced plate 142 will abut against the bottom portion of the push block 160 of the latch member 16 such that the pivotal shaft 164 could be effectively prevented from warpage and deformation resulted from excessive operating force. Additionally, a recess 1602 is disposed on the bottom portion of the push block 160 to help the supporting element 1420 abuts against the push block 160 easily.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An IC socket, comprising:
    a socket body;
    a plurality of contacts received in the socket body;
    an actuator mounted on the socket body and moveable up-and-down relative to the socket body; and
    a latch member configured to have one end thereof adapted to be connected with the actuator via a pivotal shaft and another end thereof movably connecting with the socket body; when the actuator is moved downwardly, the pivotal shaft is pushed downwardly and drives the latch member to rotate from a closed position to an open position;
    wherein the actuator defines a supporting element extending to a position under the latch member for abutting against the latch member during the rotational movement of the latch member;
    wherein the actuator comprises a frame and an reinforced plate extending from the frame, the frame being moveable up-and-down relative to the socket body, the supporting element being disposed on the reinforced plate;
    wherein the latch member defines a push block, one end of the push block connecting with the frame via the pivot shaft, another end of the push block movably connecting with the base via a connecting bar;
    wherein the supporting element extends to a position under the push block of the latch member, the push block defining a recess configured to engage with the supporting element.

2. The IC socket as claimed in claim 1, wherein socket body comprises a base and an adapter moveably mounted on the base.

3. The IC socket as claimed in claim 2, wherein the plurality of contacts is received in the base.

4. The IC socket as claimed in claim 3, wherein a plurality of springs is arranged between the base and the adapter.

5. The IC socket as claimed in claim 1, further comprising a plurality of spring members disposed between the socket body and the actuator for urging upward movement of the actuator.

6. An IC socket, comprising:
    a socket body;
    a plurality of contacts received in the socket body;
    an actuator mounted on the socket body and moveable up-and-down relative to the socket body; and
    a latch member configured to have one end thereof adapted to be connected with the actuator via a pivotal shaft and another end thereof movably connecting with the socket body;
    when the actuator is moved downwardly, the pivotal shaft is pushed downwardly and drives the latch member to turn from a closed position to an open position;
    wherein the IC socket further comprises a supporting member disposed between the socket body and the actuator and at a position under the latch member for supporting the latch member during rotational movement of the latch member.
    wherein the actuator comprises a frame and an reinforced plate extending from the frame, the frame being moveable up-and-down relative to the socket body, the supporting member being disposed on the reinforced plate;
    wherein the latch member defines a push block, one end of the push block connecting with the frame via the pivot shaft, another end of the push block movably connecting with the base via a connecting bar;
    wherein the supporting member extends to a position under the push block of the latch member, the push block defining a recess configured to engage with the supporting member.

7. The IC socket as claimed in claim 6, wherein the supporting element is disposed on a reinforced plate integrated with the actuator.

8. The IC socket as claimed in claim 6, wherein the socket body comprises a base and an adapter moveably mounted on the base.

9. The IC socket as claimed in claim 8, wherein the plurality of contacts is received in the base.

10. The IC socket as claimed in claim 9, wherein the plurality of springs is arranged between the base and the adapter.

11. The IC socket as claimed in claim 10, wherein a reinforced frame is mounted on an upper face of the base.

12. A socket connector comprising:
an socket body;
a plurality of contacts disposed in the socket body;
an actuator mounted upon the socket body and up and down moveable relative to said socket body;
a latch member pivotally mounted to the actuator between opening and closed position with regard to the actuator;
a spring member disposed between the socket body and the actuator to constantly urge the actuator away from the socket body;
a first metallic reinforcement member mounted upon the socket body; and
a second metallic reinforcement member associated with the actuator;
wherein the first metallic reinforcement member and the second metallic reinforcement member essentially intimately confronts each other when the actuator moves to a lowest position with regard to the socket body;
wherein the actuator comprises a frame and the second metallic reinforcement member extending from the frame, the frame being moveable up-and-down relative to the socket body;
wherein a supporting member being disposed on the second metallic reinforcement member;
wherein the latch member defines a push block, one end of the push block connecting with the frame via the pivot shaft, another end of the push block movably connecting with the base via a connecting bar;
wherein the supporting member extends to a position under the push block of the latch member, the push block defining a recess configured to engage with the supporting member.

13. The socket connector as claimed in claim 12, wherein the second metallic reinforcement member includes a supporting element extending inwardly horizontally to contact the first metallic reinforcement member when said actuator moves to said lowest position.

14. The socket connector as claimed in claim 13, wherein said supporting element upwardly supports the latch member around a pivotal axis about which said latch member is pivotal on the actuator.

15. The socket connector as claimed in claim 14, wherein said second metallic reinforcement member is equipped with a vertical supporting plate through which said pivotal extends.

\* \* \* \* \*